US005589698A

United States Patent [19]
Nakashiba

[11] Patent Number: 5,589,698
[45] Date of Patent: Dec. 31, 1996

[54] SOLID STATE IMAGING DEVICE HAVING SLIDING POTENTIAL GRADIENT

[75] Inventor: Yasutaka Nakashiba, Tokyo, Japan

[73] Assignee: NEC Corporation, Tokyo, Japan

[21] Appl. No.: 350,897

[22] Filed: Dec. 7, 1994

[30] Foreign Application Priority Data

Dec. 10, 1993 [JP] Japan .................... 5-310513

[51] Int. Cl.$^6$ .................... H01L 27/148; H01L 29/768
[52] U.S. Cl. .................... 257/231; 257/232; 257/233; 257/240; 257/243
[58] Field of Search .................... 257/232, 233, 257/231, 229, 240, 243

[56] References Cited

U.S. PATENT DOCUMENTS

| | | | |
|---|---|---|---|
| 4,987,466 | 1/1991 | Shibata et al. | 257/231 |
| 5,182,622 | 1/1993 | Iizuka et al. | 257/231 |
| 5,286,989 | 2/1994 | Yonemoto | 257/232 |
| 5,365,093 | 11/1994 | Kuno | 257/231 X |

FOREIGN PATENT DOCUMENTS

| | | |
|---|---|---|
| 58-125969 | 7/1983 | Japan . |
| 63-14467 | 1/1988 | Japan . |
| 2-304939 | 12/1990 | Japan .................... 257/240 |

*Primary Examiner*—William Mintel
*Attorney, Agent, or Firm*—Popham, Haik, Schnobrich & Kaufman, Ltd.

[57] ABSTRACT

A charge transfer device for making a compact solid state imaging apparatus. The device has a sloping potential gradient in the vertical to horizontal charge coupling region to achieve an increasing fringe electrical field without increasing the actual electrode width or the actual channel widths. A first region, serving as the charge storage region, at the terminal end of the vertical charge transfer section, is broadened gradually towards the horizontal charge transfer section while narrowing the terminal end of the second region, serving as the charge barrier region, towards the horizontal charge transfer section. The effective width changes of the storage and barrier regions take place in a complementary manner within one vertical channel section so that the actual width of the channel section remains constant.

9 Claims, 10 Drawing Sheets

SOLID STATE IMAGING DEVICE HAVING SLIDING POTENTIAL GRADIENT

BACKGROUND OF THE INVENTION

1. Field of the Invention

The present invention relates to a solid state imaging device utilizing a charge transfer device.

2. Technical Background

A first example of a block diagram of a conventional solid state imaging circuit is shown in FIG. 5. FIG. 5 shows a part of the circuitry of a conventional solid state imaging apparatus based on the so-called interline transfer method. This type of apparatus comprises a plurality of vertical charge transfer sections 501 each having a plurality of line charge transfer elements; a plurality of photo-electric conversion elements 502 arrayed in rows and columns, each column being disposed adjacent to one side of the associated vertical charge transfer section 501; a horizontal charge transfer section 503 electrically coupled with a terminal end of each vertical charge transfer section 501; and an output section 504 disposed on one end of the horizontal charge transfer section 503.

FIG. 6 shows an enlarged view of the device structure of a portion 505 as shown in FIG. 5. This portion indicates respective parts of the vertical charge transfer section 501 and the horizontal charge transfer section 503. In FIG. 6, the region bounded by the dotted line represents a channel region which comprises a channel region 601 inclusive of the vertical charge transfer section, and a channel region 605 inclusive of the horizontal charge transfer section. The channel region 601 of the vertical charge transfer section is fabricated with first vertical charge transfer electrodes 602, 604 which are overlaid with a second vertical charge transfer electrode 603 and a final vertical charge transfer electrode 604 functions as the transfer electrode to transfer signal charges from the vertical charge transfer section 501 to the horizontal charge transfer section 503.

The channel region 605 of the horizontal charge transfer section is fabricated with first horizontal charge transfer electrodes 606, 607 which are overlaid with second horizontal charge transfer electrodes 608, 609. In general, these electrodes are fabricated from double layers of polysilicon, and the first horizontal electrodes 606, 607 and the first vertical electrodes 602, 604 are fabricated on the first polysilicon layer; and the second horizontal electrodes 608, 609 and the second vertical electrode 603 are fabricated on the second polysilicon layer. This unit device pattern, constituted by the electrodes 606, 607, 608 and 609, is repeated in the horizontal direction. The channel region 605 of the horizontal charge transfer section comprises: a first region 611, of the channel region of the horizontal charge transfer section, serving as the charge storage region; and a second region 612, of the channel region 605 of the horizontal charge transfer section, serving as the charge barrier region.

The first horizontal charge transfer electrode 606 operates in a pair with the second horizontal charge transfer electrode 608, and the first horizontal electrode 607 operates in a pair with the second horizontal charge transfer electrode 609, to respectively constitute a pair of electrodes across the two polysilicon layers. Each pair of electrodes receives a clock pulse signal of its own having a 180 degree opposing phase relationship to the other clock pulse signal, such as $\phi H_2$ and $\phi H_2$ shown in FIG. 7. The first horizontal electrode 606 and the second horizontal electrode 608 receive the same pulse signal, $\phi H_1$ for example. The first horizontal electrode 606 is fabricated on the first region 611 serving as the charge storage region for the horizontal charge transfer section, and the second horizontal electrode 608 is fabricated on the second region 612 serving as the charge barrier section for the vertical charge transfer section; therefore, even under the same applied pulse signal, a potential difference $\phi$ is generated between the channel regions 611, 612. This potential difference $\phi$ provides the directionality in the charge transfer process. Furthermore, the terminal end of the channel region 601 of the horizontal charge transfer section (shown at far left in FIG. 6) comprises: a first region 613 (of the channel region of the vertical charge transfer section); and a second region 614 (of the terminal end of the channel region of the vertical charge transfer section), in which the first region 613 is overlaid with a part of the horizontal charge transfer electrode 606, and the second region 614 is overlaid with a part of the second horizontal charge transfer electrode 608. The second horizontal charge transfer electrode 608 in the regions 613, 614 is shaped orthogonal so as to cover over the spaces between the first vertical charge transfer electrode 604 and a part of the first horizontal charge transfer electrode 606. This orthogonal part overlays the second region 614 disposed at the terminal end of the vertical charge transfer section.

The second region 614 (of the terminal end of the channel region of the vertical charge transfer section) serves as the charge barrier region formed at the coupled region between the vertical charge transfer section 501 and the horizontal charge transfer section 503. The fact that the second region 614 (which serves as the charge barrier region) is driven by the the second horizontal charge transfer electrode 608 assures that the pulse signals applied on the first horizontal charge transfer electrode 606 and on the second horizontal charge transfer electrode 608 are in phase with the electrical potential of the barrier region.

Therefore, when the voltage applied on the horizontal charge transfer electrodes 606, 608 changes from a high level to a low level, in other words, when the charges stored in the first horizontal charge transfer electrode 606 are transferred in the horizontal direction, the voltage potential at the charge barrier region also becomes shallow, thus preventing the charges (to be transferred) from reversing back to the vertical charge transfer section 501 by going over the charge barrier region. This technology is disclosed in detail in a Japanese Laid-Open Patent Application No. Sho58-125969.

FIG. 8 is a schematic representation of a cross section of the coupling region along a line I—I shown in FIG. 6. The first and second vertical charge transfer electrodes 604, 603; the first and second horizontal charge transfer electrodes 606, 608; are fabricated on the top surface of a semiconductor substrate 801 (p type) with an intervening insulation film 802. Formed in the substrate 801 under the first and second vertical charge transfer electrodes 604 and 603 and the first horizontal charge transfer electrode 606 are buried channel layers 803-1 and 803-2 having an opposite conductivity type (n type) to the substrate 801 (p type). The layer 803-2 serves as charge storage regions 611 and 613. Below the second horizontal charge transfer electrode 608, a buried channel layer 804 of an opposite conductivity type (n⁻type) is formed, and serves as the charge barrier region (612/614). The electrical potential of the second regions 612, 614 (charge barrier region) is made smaller than that of the first regions 611, 613 (charge storage region). Outside regions of the channel regions are represented as a channel stopper region 805 (p⁺type) of the same conductivity type as the semiconductor substrate 801.

The operation of the solid state imaging apparatus of the configuration presented above will be described with reference to FIG. 5.

Signal charges, accumulated in relation to the energy of the light inputted into the photo-electric converter elements 502, are read out by the vertical charge transfer sections 501 in accordance with the frame period or the field period of the imaging signal. Subsequently, the signal charges are transferred down successively inparallel within the group of the relevant vertical charge transfer sections 501. The signal charges thus transferred to the terminal end of the group of the vertical charge transfer sections 501 are transferred in parallel to the horizontal charge transfer section 503 in accordance with the horizontal transfer timing. The signal charges transferred to the horizontal charge transfer sections 503 are transferred successively in the horizontal direction while the next period of signal charges are being transferred from the group of vertical charge transfer sections 501. The signal charges are then outputted from the signal output section 504 as imaging signals.

The details of the transfer process of signal charges from the vertical charge transfer sections 501 to the horizontal charge transfer sections 503 will be explained with reference to FIGS. 9A and 9B. Note that FIG. 9A shows a cross section of the coupling regions of the signal charge transfer device and FIG. 9B shows a schematic illustration of the distribution of the relevant electrical potentials. The signal charges are accumulated in the terminal electrode during the ON-period (shown in the potential diagram by the dotted line) of the vertical charge transfer section, and the accumulated charges are transferred via the second region 614 and first region 613 to the first region 611 for charge storage when the terminal electrode enters the OFF-period (shown in the potential diagram by the solid line). In this case, even though both regions 611 and 613 are channel regions which are overlaid with the horizontal charge transfer electrode 606, their electrical potentials, $\phi H$ and $\phi V_2$, for these regions 613, 614 are different, as shown by the steps in the potential diagram. The difference in the potential $\phi$ is caused by the fact that the first region 613 is disposed in the channel regions of the vertical charge transfer section, and its channel width $W_{V2}$ is narrower than the channel width $W_H$ Of the horizontal charge transfer section. The channel width shown by $W_H$ in FIG. 9, for the horizontal charge transfer section, is the major channel width for the first region 611. When the channel width becomes narrow, the electrical field leaks to both sides of the channel, and the wasted area becomes no longer negligible, and therefore, as the channel width becomes narrow, the electrical potential associated with the narrow channel region becomes low. This is the so-called narrow channel effect.

An example of the electrical potential dependence of the channel width is shown in FIG. 10, which shows that the electrical potentials are different for different channel widths. For this reason, the stepwise potential distribution shown in FIG. 9B is produced.

In the conventional solid state imaging apparatus, the generation of black vertical lines in the process of charge transfer from the vertical charge transfer section 501 to the horizontal charge transfer section 503 is prevented by using the narrow channel effect described above, by means of a fringe electrical field having such stepwise distribution of potential from the vertical section 501 to the horizontal section 503, so as to shorten the transfer time for the signal charges to transfer from the vertical charge transfer section 501 to the horizontal charge transfer section 503.

However, with the trend towards densification of pixels while making the apparatus compact, there has also been a trend towards coupling bonding with shallow buried channels, so as to improve the charge transfer efficiency per unit area of the vertical charge transfer section. In such technology, there is a problem that the generation of vertical black lines increases due to the fact that the strength of the fringe electrical field of shallow buried channels is insufficient, causing the charge transfer time, i.e. efficiency, to increase longer from the vertical charge transfer section to the horizontal charge transfer section. The generation of vertical black lines thereby become a severe problem.

A remedy procedure for this problem is disclosed in a Japanese Patent Laid-Open Application No. Sho63-14467, in which the channel spacing W of the vertical charge transfer electrode 604 is widened to allow an increase in the fringe electrical field strength. However, this technique applied to the conventional technology described above results in little increase in the channel width $W_V'$ as shown in FIG. 11, and little improvement in performance. On the other hand, if the channel width is increased to $W_V''$ as shown in FIG. 12, it naturally occurs that the spacing of the first horizontal charge transfer electrodes 606 is increased from L to L'. To retain the channel spacing between the photo-electric converters at W (i.e., without increasing the width to W'), the electrode widths for the other electrodes must be narrowed. However, such an approach would lead to an unbalance in the electrode configuration in the horizontal charge transfer section, and leads to significant design and performance problems in the charge transfer capacity and speed.

SUMMARY OF THE INVENTION

The present invention resolves the problems associated with the fringe electrical field strength by methods other than widening of the actual channel width. The present inventors discovered that fringe electrical field strength is increased by providing changes in geometrical shaping of an ion injected layer in the channel regions, enabling the fringe electric field strength to increase without resorting to widening of the actual channel width thereby improving the charge transfer time (thus efficiency) of signal charge transfer from the vertical charge transfer section to the horizontal charge transfer section.

To achieve the above objective, a solid state imaging apparatus according to the present invention comprises: a plurality of photo-electric converter elements, a vertical charge transfer section receiving signal charges generated by said photo-electric converter elements and transferring said signal charges through a vertical channel, a horizontal charge transfer section receiving said signal charges transferred from said vertical channel section and transferring said signal charges through a horizontal channel section, and a coupling region provided to transfer said signal charges from said vertical channel section to said horizontal channel section so as to generate a sliding potential gradient from said vertical channel section towards said horizontal channel section.

According to the apparatus of the above configuration, the strength of the fringe electrical field is maintained without broadening the width of the actual electrodes or of the actual channels, by providing a sliding potential gradient in the actual width of the first region of the terminal end, and by suitably adjusting the potential distribution within a given width of the vertical charge transfer channel.

In an another aspect of the present invention, a third region having the same doping level as the second region and acting as a non-active charge storage region is provided.

The third region has the same doping level as the second region and is overlaid with a second transfer electrode. This circuit configuration is easily fabricated and provides equally effective performance.

In both of these aspects of the invention, the electrical potential of the terminal end of the vertical channel is increased towards the horizontal charge transfer section by providing a sliding potential gradient which gradually increases from the vertical charge transfer section to the horizontal charge transfer section. The gradient electrical potential is achieved by complementary changes in the effective widths of the charge storage and barrier regions of the terminal end of the channels while maintaining a given specific width of the vertical charge transfer channel. This sliding potential gradient is achieved without increasing the actual widths of the electrode or of the channel widths themselves, but by adjusting the electrical potentials of within the terminal end of the vertical channel so as to control the mutual widths of the charge storage and barrier regions within the vertical channel.

By adopting the sliding potential gradient configuration presented above, the signal charge transfer time from the vertical charge transfer section to the horizontal charge transfer section is shortened, thus increasing the efficiency of the imaging apparatus without increasing the width of the electrodes or the channels, and enabling the apparatus to be more compact than conventional apparatus based on a conventional imaging element,

BRIEF DESCRIPTION OF THE DRAWINGS

The above and other objects, features and advantages of the present invention will become more apparent from the following description taken in conjunction with, in which.

DETAILED DESCRIPTION OF THE PREFERRED EMBODIMENTS

Figure 1:
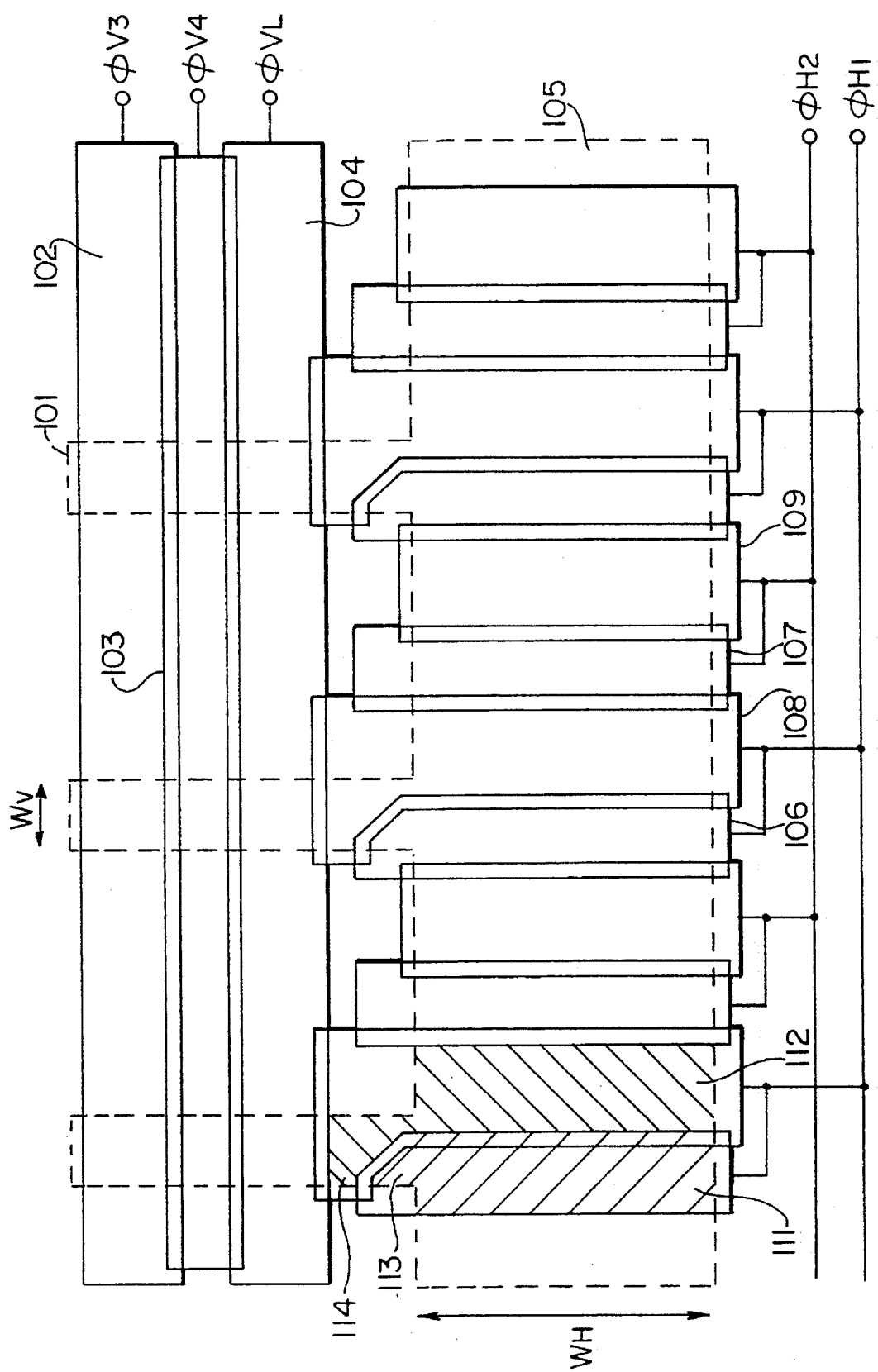
FIG. 1 is a plan view of a coupling region between a vertical charge transfer section and a horizontal charge transfer section according to a first embodiment of the present invention.
Figure 5:
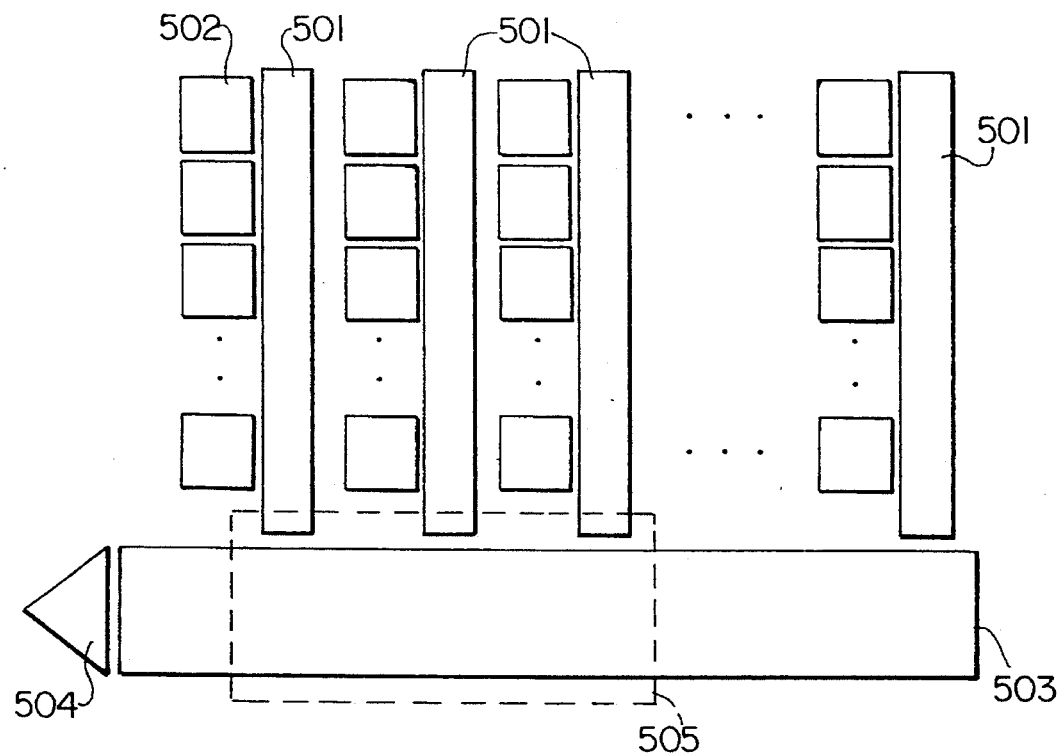
FIG. 5 is a schematic representation of an interline type solid state imaging device.

Referring now to FIG. 1, there is shown an enlarged view of the coupling region 505 of the device shown in FIG. 5, between the vertical charge transfer section 501 and the horizontal charge transfer section 503. The region bounded by the dotted line is the channel region comprising a channel region 101 of one vertical charge transfer section; and a channel region 105 of the horizontal charge transfer section. The channel region 101 is fabricated with first vertical charge transfer electrodes 102, 104 and an overlayer of a second vertical charge transfer electrode 103, and the first vertical charge transfer electrode 104 serving as the terminal electrode to transfer the signal charges from the vertical charge transfer section 501 to the horizontal charge transfer section 503. The channel region 105 of the horizontal charge transfer section is fabricated with the first horizontal charge transfer electrodes 106, 107 and overlayers of the second horizontal charge transfer electrodes 108, 109. Generally, these electrodes are fabricated of, two layers of polysilicon, and the first horizontal charge transfer electrodes 106, 107 and the first horizontal charge transfer electrodes 102, 104 are fabricated on the first polysilicon layer, and the second horizontal charge transfer electrodes 108, 109 and the second vertical charge transfer electrode 103 are fabricated of the second polysilicon layer. The electrode unit constituted by the electrodes 106, 107, 108 and 109 are fabricated repeatedly in the horizontal direction.

Figure 7:
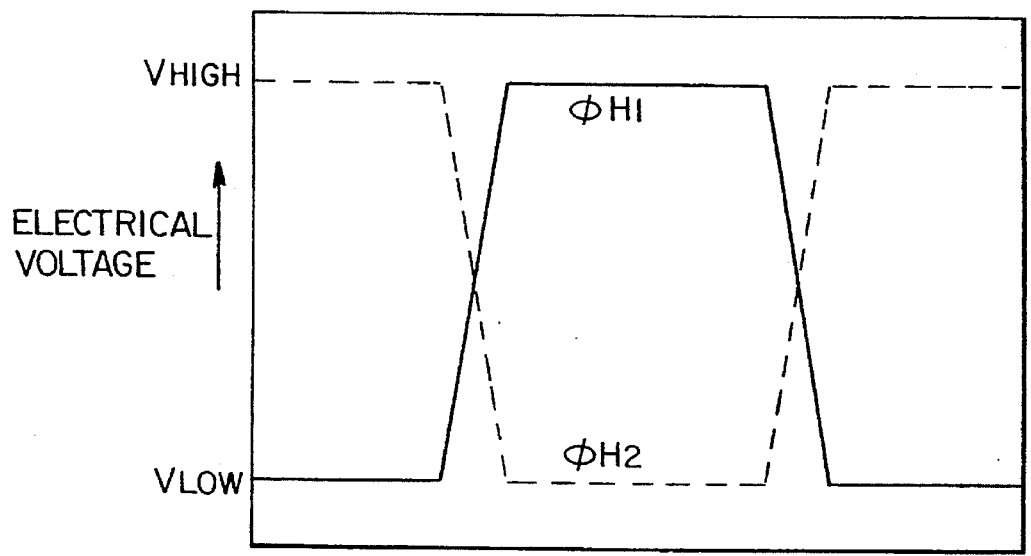
FIG. 7 is a schematic representation of a pair of clock pulse signals having opposite phase relationship applied to the conventional horizontal charge transfer section.
Figure 6:
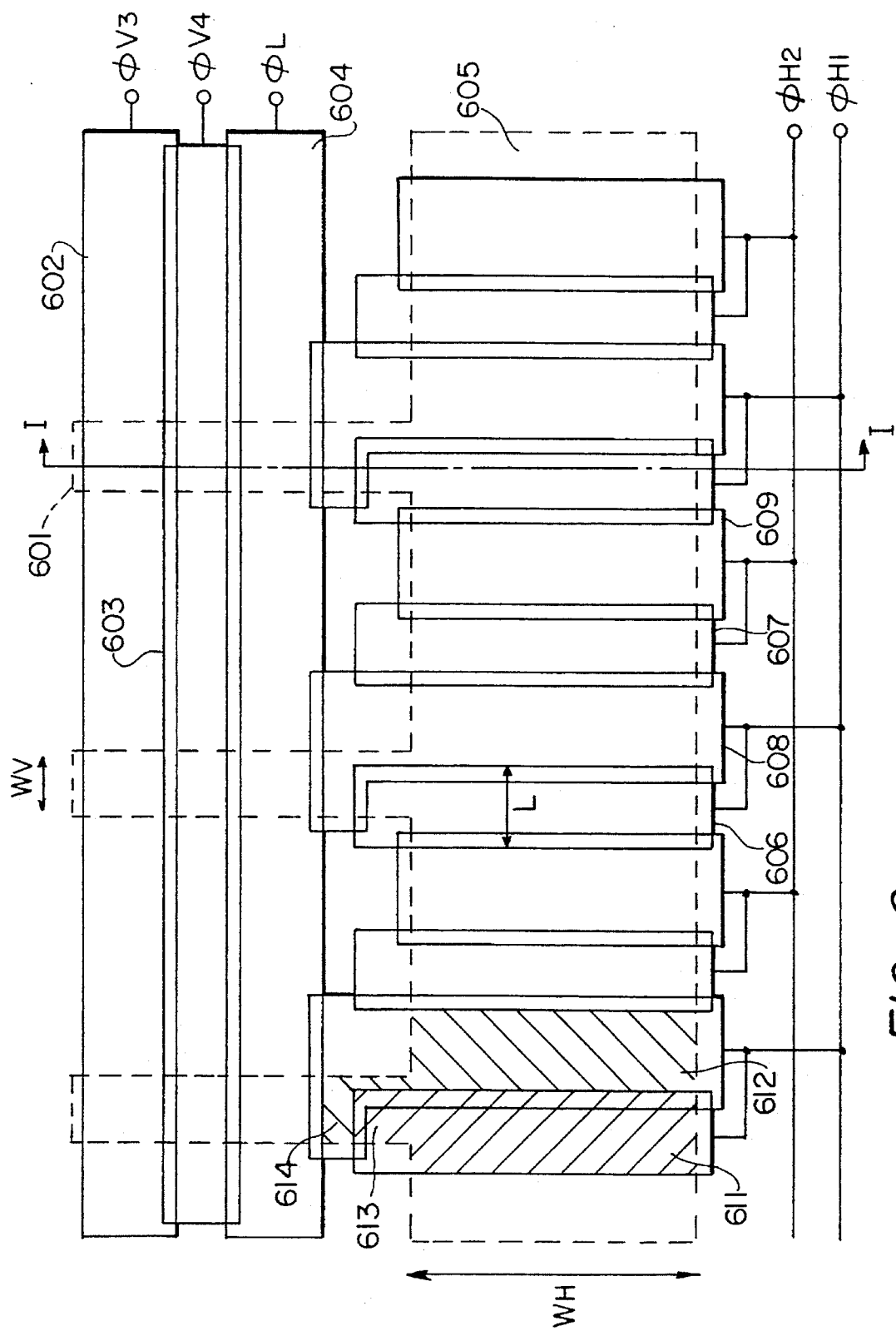
FIG. 6 is a plan view of the coupling region between the vertical charge transfer section and the horizontal charge transfer section in the conventional charge transfer circuit configuration.
Figure 8:
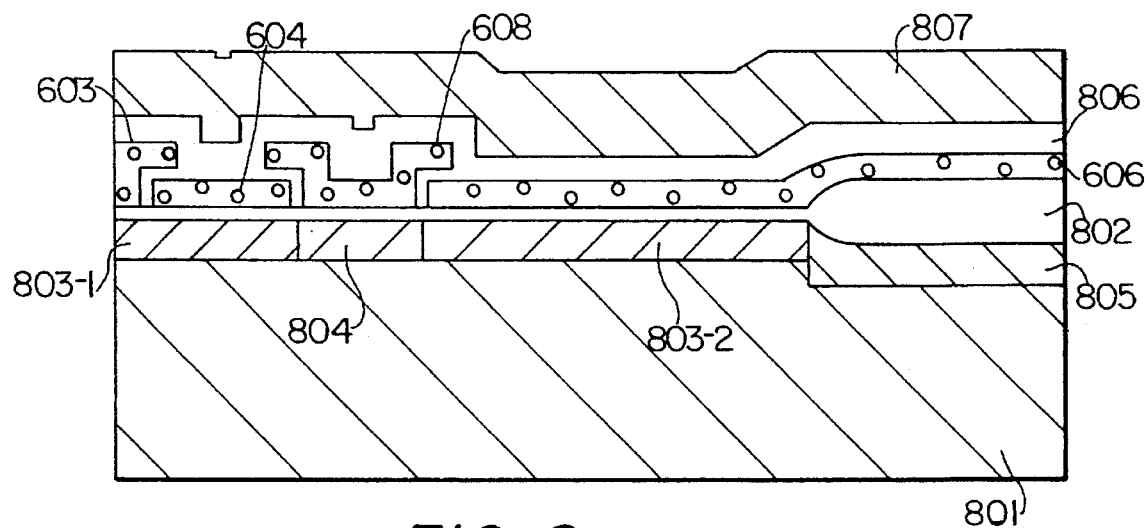
FIG. 8 shows a cross sectional view of the coupling region between the vertical charge transfer section and the vertical charge transfer section in the conventional circuit configuration.
Figure 10:
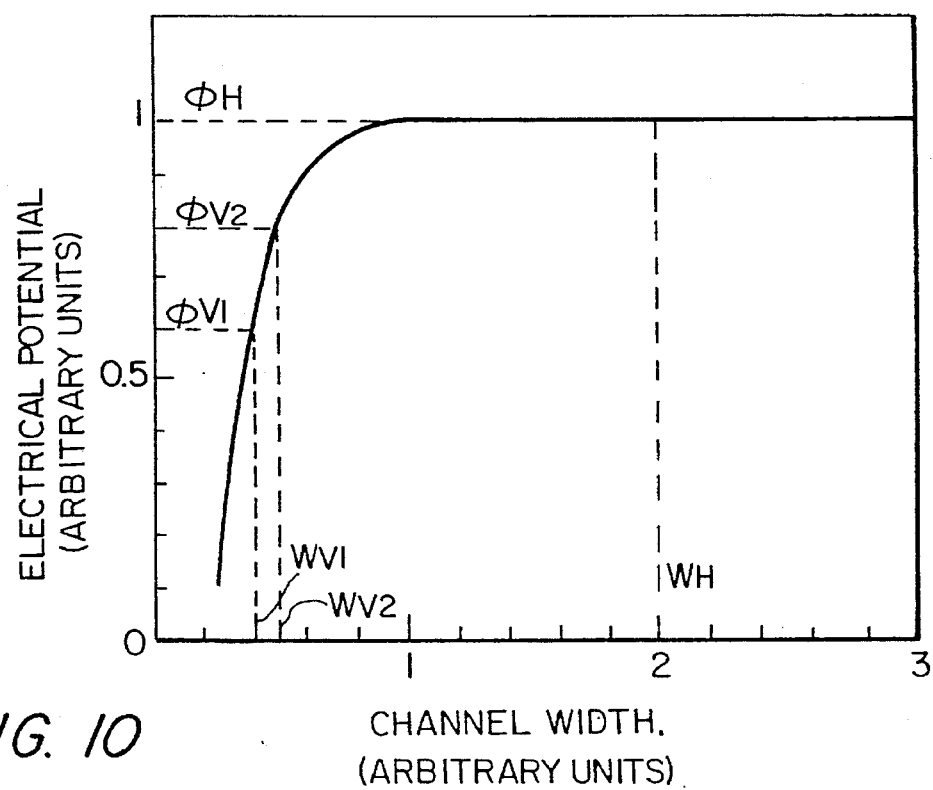
FIG. 10 is an example of the narrow channel effect.
Figure 9A:
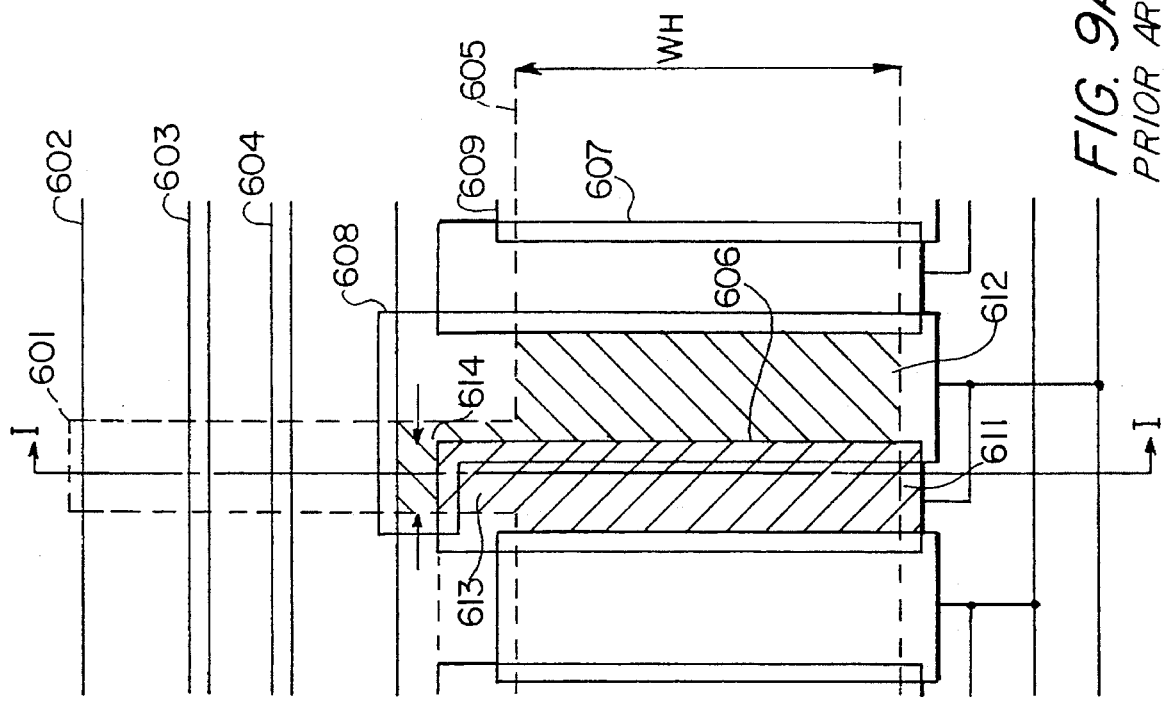
FIG. 9A shows a cross section of coupling regions of a signal charge transfer device.
Figure 9B:
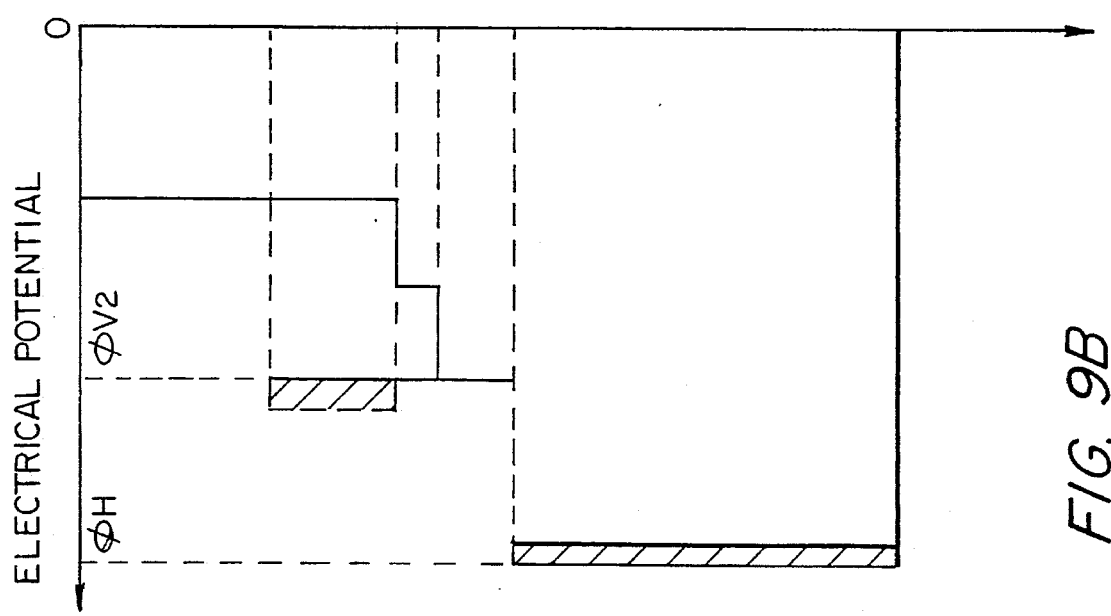
FIG. 9B shows a schematic illustration of distribution of relevant electrical potentials in the coupling region I—I for the device of FIG. 9A.
Figure 11:
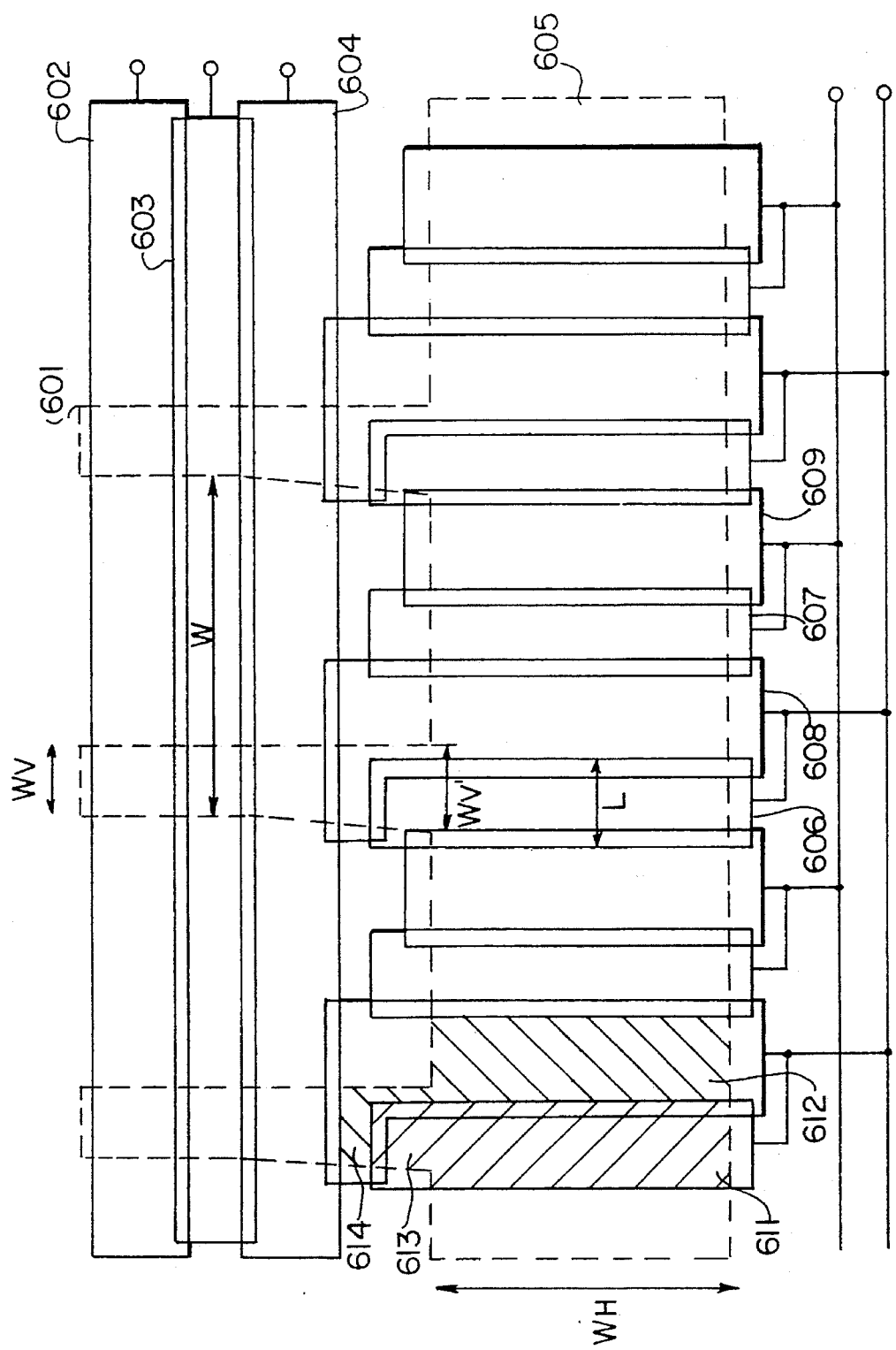
FIG. 11 is an example of broadening the channel width in a conventional circuitry without widening the channel widths.
Figure 12:
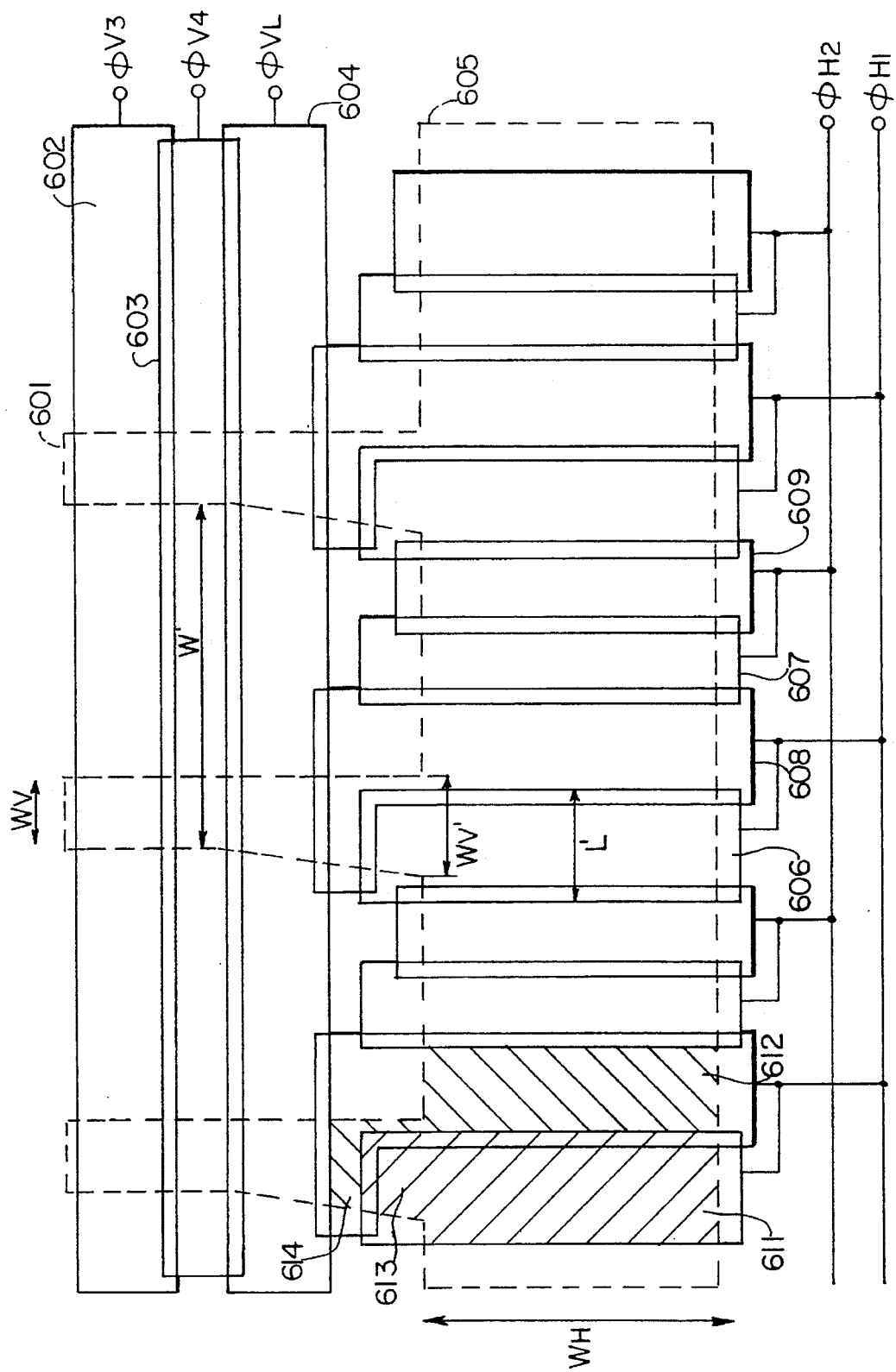
FIG. 12 is an example of broadening the channel width in a conventional circuitry by widening the electrode width.

The channel region 105 of the horizontal charge transfer section comprises: a first region 111 (of the channel region of the horizontal charge transfer section) serving as the charge storage region; a second region 112 (of the channel region of the horizontal charge transfer section) serving as the charge barrier region. The horizontal charge transfer electrodes 106, 108 form a pair of electrodes and 107, 109, form another pair of electrodes respectively, and each pair of electrodes receives a clock pulse of its own having a 180 degree opposing phase relationship to the other clock pulse signal, such as $\phi H_1$ and $\phi H_2$ shown in FIG. 7. The same signal is applied to the first horizontal charge transfer electrode 106 and the second horizontal charge transfer electrode 108. However, the first horizontal charge transfer electrode 106 overlays the first region 111 (of the channel region of the horizontal charge transfer section) serving as the charge storage region, and the second horizontal charge transfer electrode 108 overlays the second region 112 (of the channel region of the horizontal charge transfer section) serving as the charge barrier region. Therefore, even when the same form of pulse signal is applied, a difference in the electrical potential is generated in the two channel regions, and the directionality of charge transfer is assured.

Further, the terminal end of the channel region 101 of the vertical charge transfer section is comprised by a first region 113 fabricated within the vertical charge transfer channel and a second region 114 fabricated within the vertical charge transfer channel. In FIG. 1, two differently hatched regions represent the first region 113 (n to serve as the storage region) and the second region 114 (n_ to serve as the barrier region) fabricated within the terminal end of the vertical charge transfer channel 101. The cross hatched regions are superimposed on the circuit configuration to show the effective widths of the charge storage region and the charge barrier region in the terminal end. The widths of the regions vary in a complementary manner as can be seen in FIG. 1.

In this circuit configuration, the first region 113 is overlaid with a part of the first horizontal charge transfer electrode 106, and the second region 114 is overlaid with a part of the second horizontal charge transfer electrode 108. The second horizontal charge transfer electrode 108 is configured at an angle so as to cover the spaces between the first vertical charge transfer electrode 104 and a part of the horizontal charge transfer electrode 106 which overlays the first region 113. The angled portion covers the second region 114 of the terminal end of the channel region of the vertical charge transfer section. This angled region is the region which overlays the second region 114 of the terminal end of the channel region of the vertical charge transfer section.

The operation of the solid state imaging apparatus of the configuration presented above is basically the same as that in the conventional solid state imaging apparatus, but the transfer of the charges, accumulated in relation to the input light, from the signal output section 504 is performed more efficiently than in the conventional imaging apparatus.

Next, the operation of the charge transfer process from the vertical charge transfer section 501 to the horizontal charge transfer section 503 will be explained with reference to FIGS. 2A and 2B.

Figure 2A:
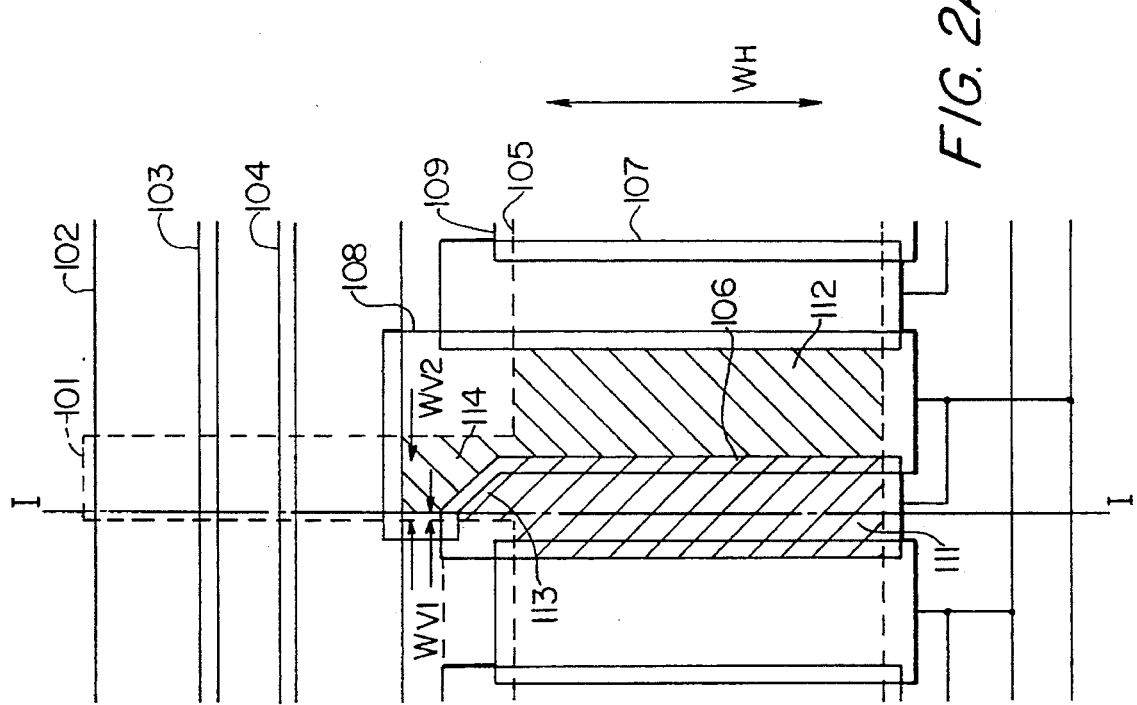
FIGS. 2A and 2B are a plan view of a coupling region and an electrical potential distribution, respectively, of the device shown in FIG. 1.
Figure 2B:
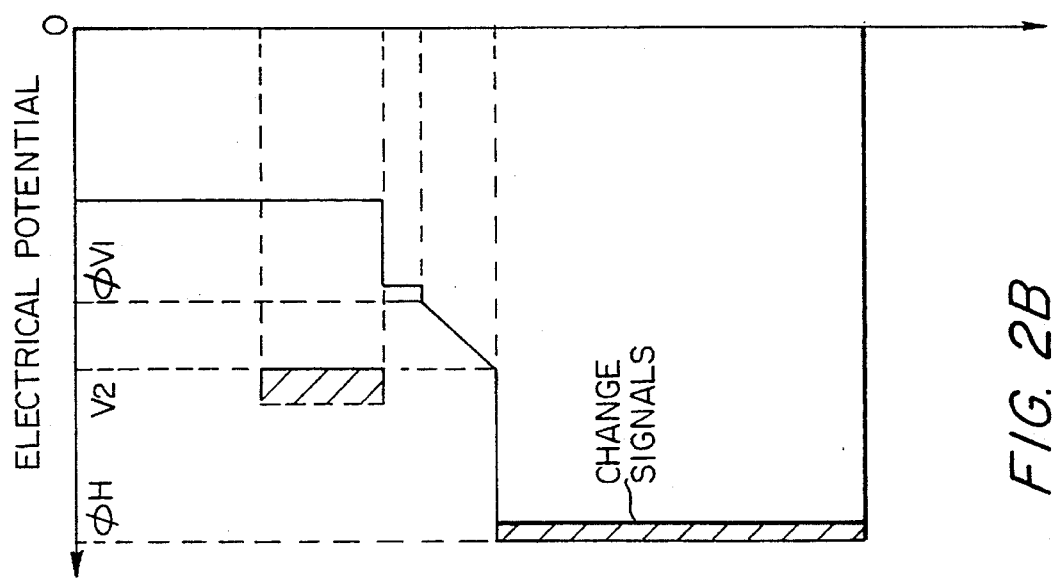

FIG. 2B is a schematic illustration of the electrical potential distribution taken at the section I—I of the coupling region shown in FIG. 2A. The signal charges are accumulated when the terminal electrode of the vertical charge transfer section is in an ON-period. When the terminal electrode enters an OFF-period (shown in FIG. 2B by solid line) the charges are transferred through the end regions 114 and 113 to the first region 111, serving as the charge storage region. In this case, the first region 113 (of the terminal end of the channel region of the vertical charge transfer section) is fabricated so that the width of the channel increases gradually towards the first region 111 (of the terminal end of the channel region of the horizontal charge transfer section). The details are shown in FIG. 2, which shows that the width $W_{V1}$ indicates the narrowest dimension in the first region 113 which is closest to the vertical charge transfer electrode 104. The width $W_{V2}$ indicates the broadest dimension in the first region 113, which is adjacent to the first region 111 which is the horizontal charge transfer section.

The shapes of the first and second horizontal charge transfer electrodes 106, 108 are fabricated to correspond with the desired shape of gradually broadening channel. In other words, the first horizontal charge transfer electrode 106 is also shaped so that it broadens gradually from the vertical charge transfer section to the horizontal charge transfer section.

As can be seen in in FIG. 2B, the electrical potential of the first region 113, having a gradually increasing channel width from $W_{V1}$ to $W_{V2}$, generates corresponding gradient potentials from $\phi V_1$ to $\phi V_2$. The result is a gradually moderating narrow channel effect and a corresponding gradual increase in the electrical potential towards the first region 111 of the channel region of the horizontal charge transfer section. The maximum potential corresponds to that generated by the full width $W_H$ of the horizontal charge transfer section. The result is the formation of a gradually increasing gradient potential, and the stronger fringe electrical field is generated towards the first region 111. The result is improved charge transfer time (thus efficiency) in the signal charge transfer process.

To obtain the improved effect of charge transfer efficiency, the values of the channel widths $W_{V1}$ and $W_{V2}$ should be chosen such that the values of the electrical potential at $W_{V1}$ and at $W_{V2}$ are different. The maximum benefit from the width broadening will be obtained, under the following preferable conditions: the channel width $W_{V1}$ should be zero and $W_{V2}$ should be the same as the width $W_V$ of the channel region 101 of the vertical charge transfer section or a width which would not suffer from the drop in the electrical potential caused by the narrow channel effect.

Also, in this embodiment, the same form of pulse signal was applied on two electrodes for the first region 111 serving as the charge storage region and for the second region 112 serving as the charge barrier region. However, it is obvious that the two regions, 111 and 112 can be overlaid with one common electrode to obtain the same effect.

A second embodiment of the present invention relates to such a configuration of the electrode and is presented as follows.

Figure 3:
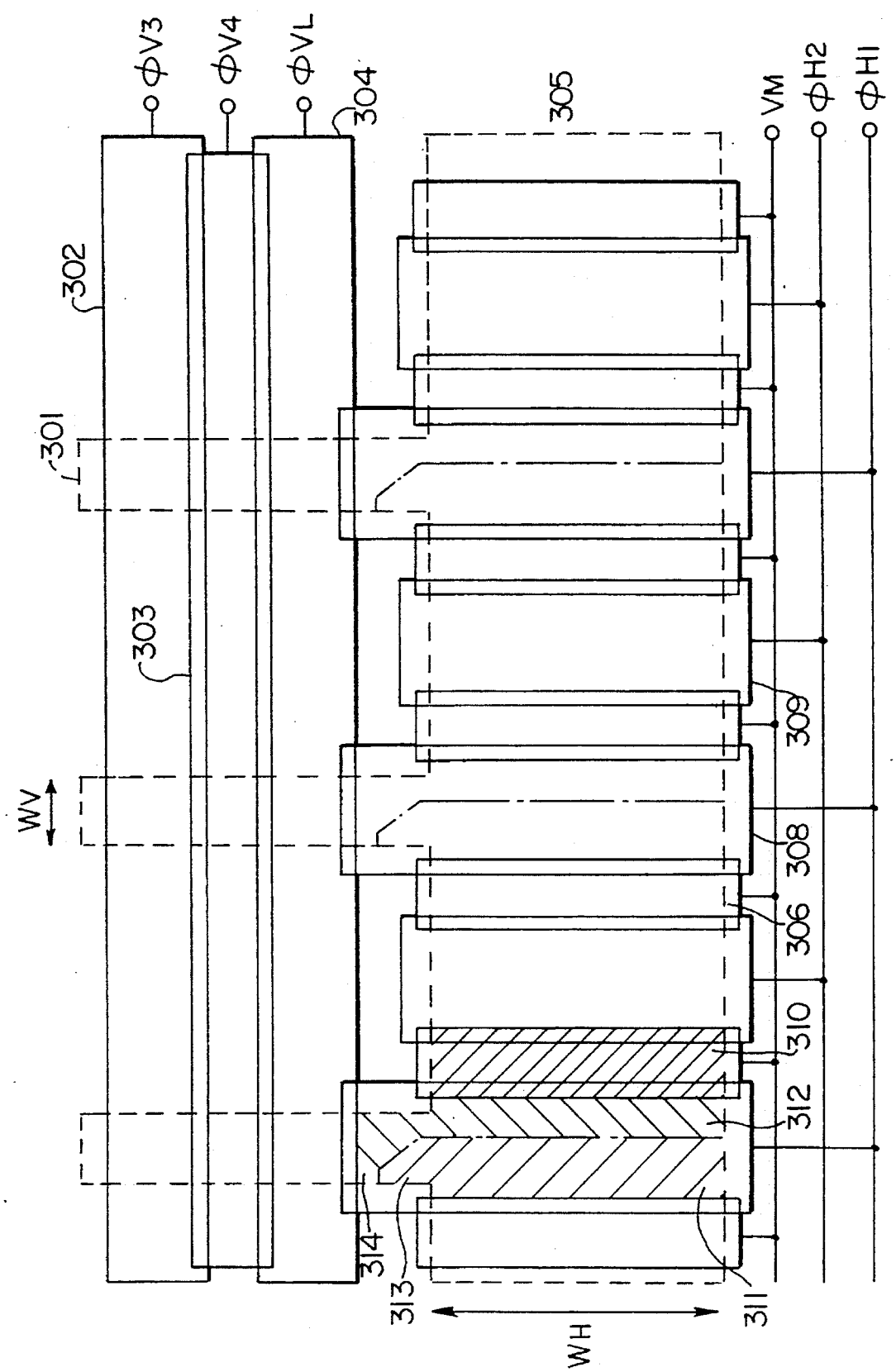
FIG. 3 is a plan view of a coupling region between a vertical charge transfer section and a horizontal charge transfer section according to a second embodiment of the present invention.

FIG. 3 shows an enlarged view of the coupling region 505 between the vertical charge transfer section 501 and the horizontal charge transfer section 503. In FIG. 3, the area bounded by the dotted line is the channel region, and comprises a horizontal charge transfer section 301 and a vertical charge transfer section 305. The channel region 301 is fabricated with first vertical charge transfer electrodes 302, 304; an overlayer of a second vertical charge transfer electrode 303; and the last electrode of the first vertical charge transfer electrodes 304 transfers signal charges from the vertical charge transfer section 501 to the horizontal charge transfer section 503 (refer to FIG. 5).

The channel region 305 of the horizontal charge transfer section 502 is fabricated with the first horizontal charge transfer electrode 306 and an overlayer of a pair of second horizontal charge transfer electrodes 308, 309. Generally, these electrodes are fabricated of two layers of polysilicon: the first horizontal charge transfer electrode 306 and the first vertical charge transfer electrodes 302, 304 are formed on the first layer of polysilicon; and a pair of the second horizontal charge transfer electrodes 308, 309 and the second vertical charge transfer electrode 303 are formed of the second layer of polysilicon. The first horizontal charge transfer electrode 306 is disposed between the second horizontal charge transfer electrodes 308, 309. This basic pattern is repeated in the horizontal direction.

The channel region 305 of the horizontal charge transfer section comprises: a first region 311 (of the channel region of the horizontal charge transfer section) serving as the charge storage region; a second region 312 (of the channel region of the horizontal charge transfer section) serving as the charge barrier region; and a third region (overlaid with the first horizontal charge transfer electrode 306) serving as the nonactive charge barrier region. It may happen that the third region 310 will have the same level of doping as the second region 312. The horizontal charge transfer electrodes 308, 309 form a pair of electrodes, and each pair is applied with a pulse signal having a 180 degree opposing phase relationship to the other clock pulse signal. The horizontal charge transfer electrode 306 is applied with a predetermined low voltage.

In this embodiment, the first region 311 and the second region 312 are overlaid with a common electrode; however, the respective channel regions have a difference in their electrical potentials, thus providing the directionality in the signal charge transfer process. Also, in the circuitry of this embodiment, the channel region 301 comprises the first region 313 and the second region 314. The regions 313, 314 are both overlaid with a part of the second horizontal charge transfer electrode 308. In other words, this part of the horizontal charge transfer electrode 308 electrically connects the channel region covered over with the first vertical charge transfer electrode 304 to the channel region 305 of the horizontal charge transfer section.

The operation of the solid state imaging apparatus of the configuration presented above is basically the same as that of the conventional solid state imaging apparatus, but the transfer of the charges, accumulated in relation to the input light, from the signal output section 504 is performed more efficiently than in the conventional imaging device.

Figure 4A:
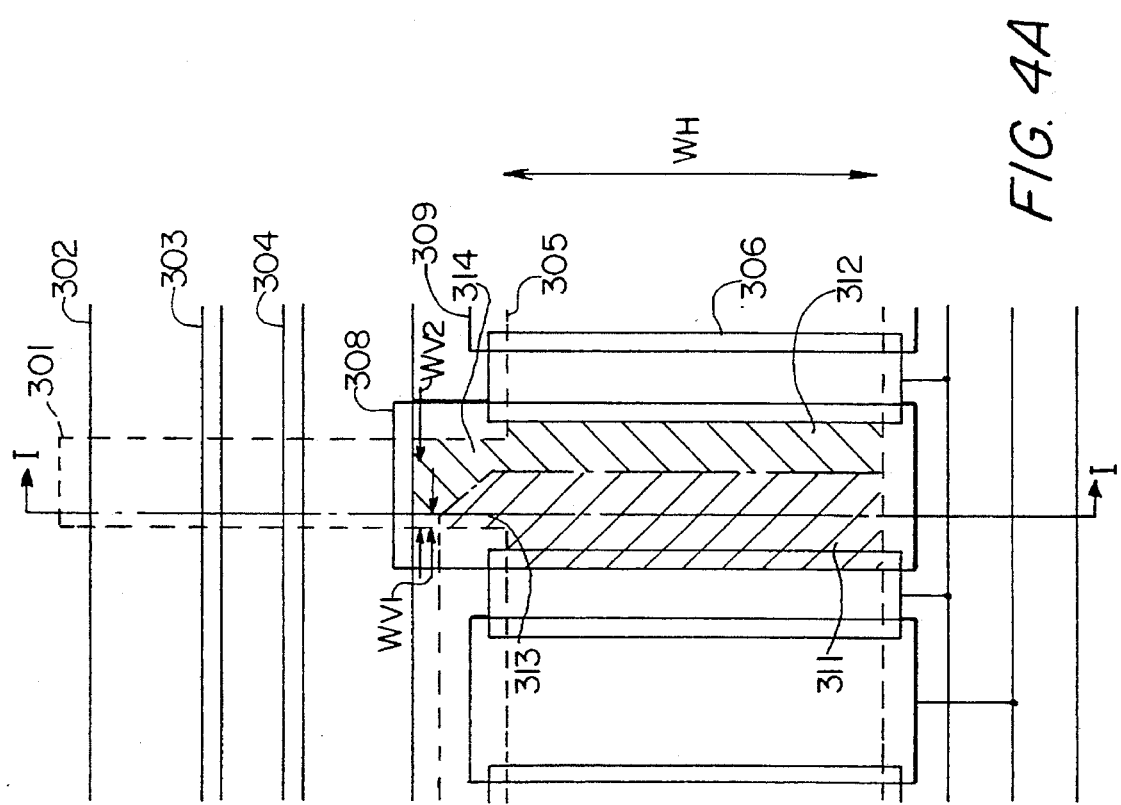
FIG. 4A and 4B are a plan view of an electrical potential distribution, respectively, of the device shown in FIG. 3.
Figure 4B:
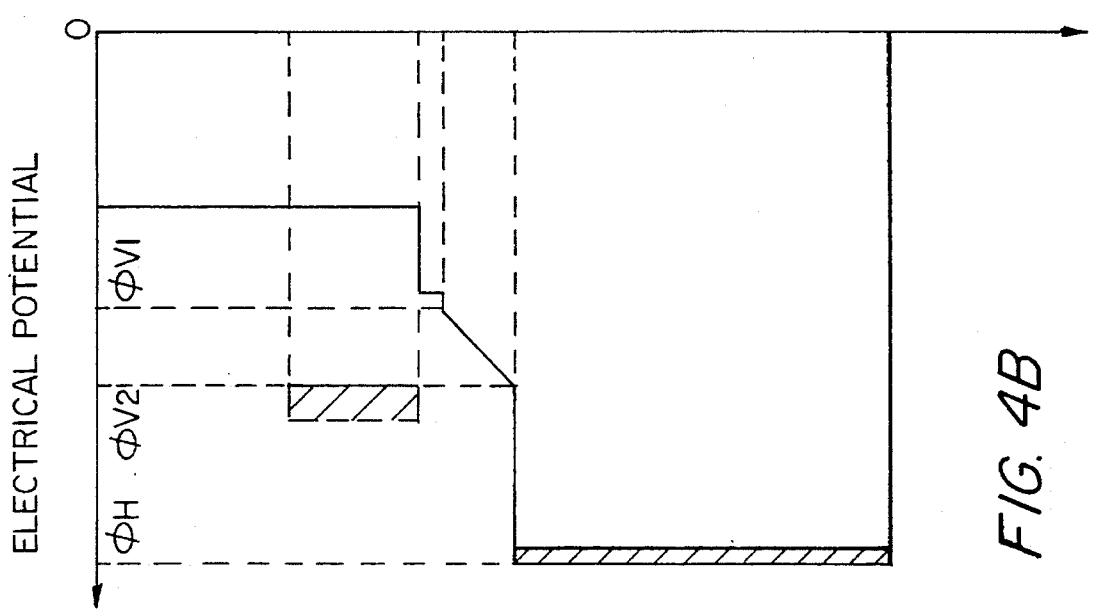

Next, the process of charge transfer from the vertical charge transfer section 501 to the horizontal charge transfer section 503 will be explained with reference to FIGS. 4A and 4B. FIG. 4B is a schematic illustration of the electrical potential distribution taken at the section I—I of the coupling region shown in FIG. 4A. The signal charges accumulated in the terminal electrode of the vertical charge transfer section during an ON-period are transferred via regions 314 and 313 to the first region 311 serving as the charge storage region when an OFF-period begins shown in FIG. 4 by the solid line. In this case, the first region 313 (of the terminal end of the channel region of the vertical charge transfer section) is fabricated so that the width of the channel increases gradually towards the first region 311 (of the terminal end of the channel region of the horizontal charge transfer section). In FIG. 4, the width $W_{V1}$ indicates the narrowest dimension in the first region 313 (of the terminal end of the channel region of the vertical charge transfer section) which is disposed closest to the channel region overlaid with the vertical charge transfer electrode 304. The width $W_{V2}$ indicates the broadest dimension in the first region 313, which is adjacent to the first region 311.

As can be understood from FIG. 4B, by changing the effective channel widths in a complementary manner, a gradually increasing channel width from $W_{V1}$ to $W_{V2}$ is formed, presenting a gradually moderating narrow channel effect, and the corresponding gradual drop in the sliding electrical potential towards the first region 311 of the channel region of the horizontal charge transfer section. The continually changing width dimension in the present invention give rise to a sliding potential gradient rather than a stepped potential gradient which is seen in the conventional circuitry. The result is the formation of a gradually deepening potential slope, and the attendant stronger fringe electrical field. The result leads to improved transfer time (thus efficiency) for the signal charges in the charge transfer process.

The above embodiments are meant to be illustrative and not restrictive. It is clear that the principle of a sliding potential gradient in a buried channel can be produced by other circuit configurations and fabrication means. Therefore, the present invention of improving the charge transfer efficiency from a vertical channel section to a horizontal channel section is limited only by the claims which follow.

What is claimed is:

1. A solid state imaging device comprising:
   a) a plurality of photo-electric converter elements;
   b) a vertical charge transfer section receiving signal charges generated by said photo-electric converter elements and transferring said signal charges through a vertical channel section;
   c) a horizontal charge transfer section receiving said signal charges transferred from said vertical channel section and transferring said signal charges through a horizontal channel section having:
      1) a first region of one conductivity type having a first impurity concentration and serving as a charge storage region, and
      2) a second region of said one conductivity type having a second impurity concentration and serving as a charge barrier region; and
   d) a coupling region including a portion of said horizontal channel section extended towards said vertical channel section with a width substantially equal to the width of said vertical channel section to provide electrical coupling therebetween, said coupling region having a potential gradient continuously changing from said vertical channel section towards said horizontal channel section generated by varying the effective channel width associated with said first region in a complementing proportion to the effective channel width associated with said second region, while maintaining said width of said coupling region constant.

2. The imaging device as claimed in claim 1, wherein:
said first region is overlaid with a first horizontal charge transfer electrode,
said second region is overlaid with a second horizontal charge transfer electrode, and
said first and second charge transfer electrodes receive a common clock pulse signal.

3. A solid state imaging device comprising:
   a) a plurality of photo-electric converter elements;
   b) a vertical charge transfer section receiving signal charges generated by said photo-electric converter elements and transferring said signal charges through a vertical channel section;
   c) a horizontal charge transfer section receiving said signal charges transferred from said vertical channel section and transferring said signal charges through a horizontal channel section including:
      1) a first region of one conductivity type having a first impurity concentration and serving as charge storage region,
      2) a second region of said one conductivity type having a second impurity concentration and serving as a charge barrier region, and
      3) a third region of said one conductivity type having a substantially same level of impurity concentration as said second impurity concentration; and
   d) a coupling region including a portion of said horizontal channel section including said first and second regions extended towards said vertical channel section to provide electrical coupling therebetween, wherein:
      1) said coupling region has a width substantially equal to the width of said vertical channel section,
      2) said coupling region has a vertical channel section,
      3) said coupling region has a potential gradient continuously changing from said vertical channel section towards said horizontal channel section, and
      4) said potential gradient is generated by varying the effective channel width associated with said first region in a complementing proportion of the effective channel width associated with said second region while maintaining said width of said coupling region constant.

4. An imaging device as claimed in claim 3, wherein:
said first region and said second region are overlaid with a second horizontal charge transfer electrode, said third region is overlaid with a first horizontal charge transfer electrode, first horizontal charge transfer electrodes of all units of said device unit are applied with a common potential, and a second horizontal electrode of one device unit is applied with a clock pulse signal.

5. The solid state imaging device as claimed in claim 1 wherein:

said first impurity concentration is greater than said second impurity concentration so that an electrical potential in said second region is shallower than said first region.

6. The solid state imaging device as claimed in claim 2 wherein:

said first impurity concentration is greater than said second impurity concentration so that an electrical potential in said second region is shallower than said first region.

7. The solid state imaging device as claimed in claim 3 wherein:

said first impurity concentration is greater than said second impurity concentration so that an electrical potential in said second region is shallower than said first region.

8. The solid state imaging device as claimed in claim 4 wherein:

said first impurity concentration is greater than said second impurity concentration so that an electrical potential in said second region is shallower than said first region.

9. The imaging device of claim 1, wherein:

channel width in said first region increases from said vertical channel section to said horizontal channel section.

* * * * *